United States Patent
Flanagan et al.

(10) Patent No.: US 6,262,634 B1
(45) Date of Patent: Jul. 17, 2001

(54) PHASE-LOCKED LOOP WITH BUILT-IN SELF-TEST OF PHASE MARGIN AND LOOP GAIN

(75) Inventors: Ian MacPherson Flanagan; Dayanand K. Reddy, both of Minneapolis, MN (US)

(73) Assignee: LSI Logic Corporation, Milpitas, CA (US)

(*) Notice: Subject to any disclaimer, the term of this patent is extended or adjusted under 35 U.S.C. 154(b) by 0 days.

(21) Appl. No.: 09/548,498

(22) Filed: Apr. 13, 2000

(51) Int. Cl.[7] .................. H03L 7/06; G01R 31/3173
(52) U.S. Cl. .................. 331/25; 331/17; 331/23; 331/44; 327/156; 327/158; 324/600; 324/602; 324/605; 324/606
(58) Field of Search .................. 331/17, 23, 25, 331/44; 327/156–159; 324/76.11, 118, 600, 602, 605, 606

(56) References Cited

U.S. PATENT DOCUMENTS 4,754,216 * 6/1988 Wong .................. 324/83 D

OTHER PUBLICATIONS

F. M. Gardner, "Charge–Pump Phase–Lock Loops", IEEE Transactions on Communications, vol. COM–28, No. 11, Nov. 1980, pp. 1849–58.
W. F. Egan, "Phase Lock Basics", Wiley Interscience Publications, New York, 1998, pp. 90–91.
P. V. Brennan, "Phase Locked Loops: Principles and Practice", McGraw–Hill, New York, 1996, p. 35.
D. H. Wolaver, "Phase–Locked Loop Circuit Design", PTR Prentice Hall, New Jersey, 1991, pp. ix–x.

* cited by examiner

*Primary Examiner*—David Mis

(57) ABSTRACT

A phase-locked loop (PLL) is provided, which includes a PLL reference input, a PLL output and a phase detection loop coupled between the PLL reference input and the PLL output. The phase detection loop has a loop filter node. A delay element is coupled within the phase detection loop and has a variable delay, which can be increased to a critical delay at which the phase detection loop becomes unstable. A demodulator is coupled to the loop filter node and is adapted to demodulate a modulated voltage on the loop filter node. The demodulator has a demodulated output, which is representative of a phase margin of the phase detection loop when the delay element has the critical delay.

25 Claims, 4 Drawing Sheets

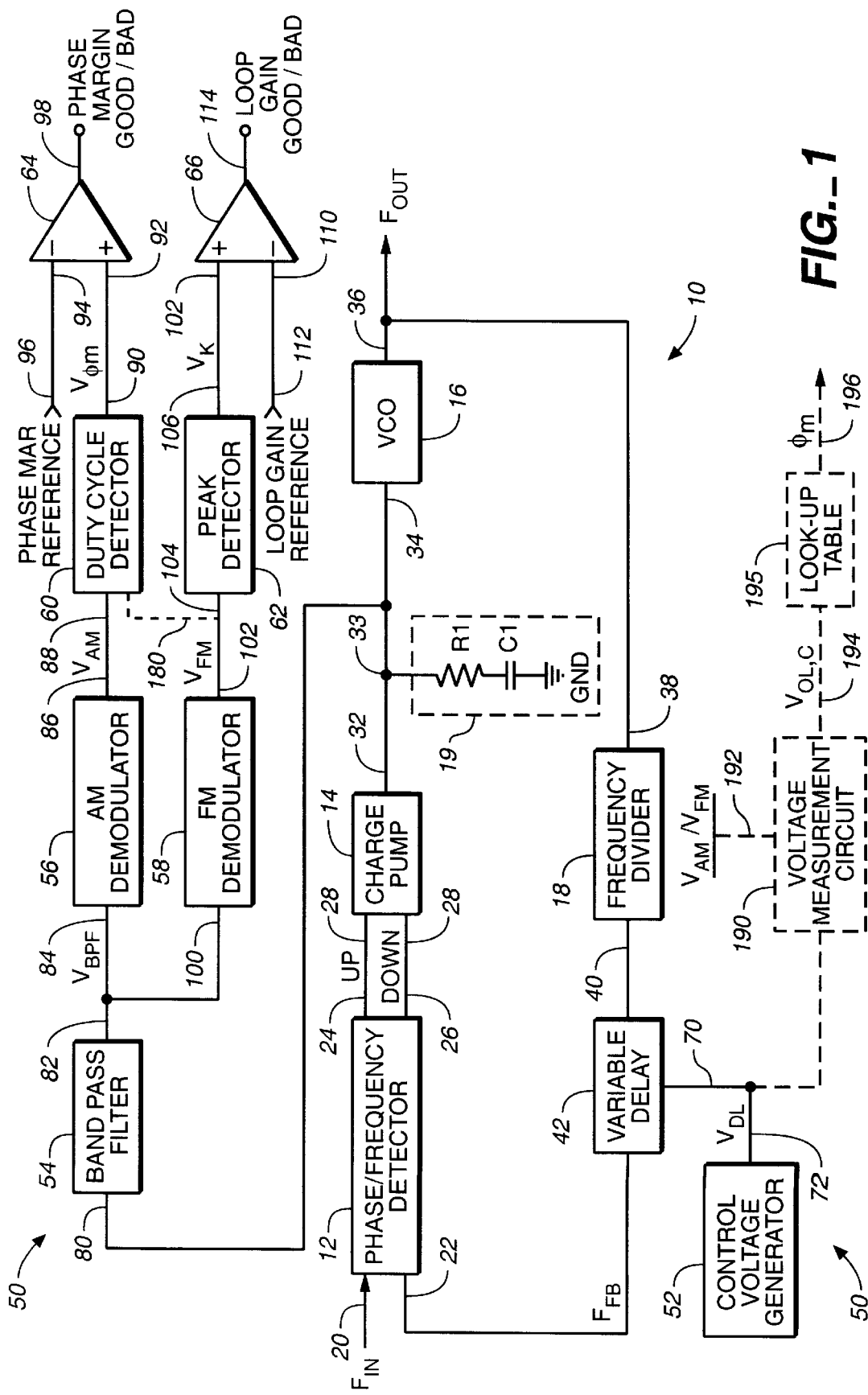

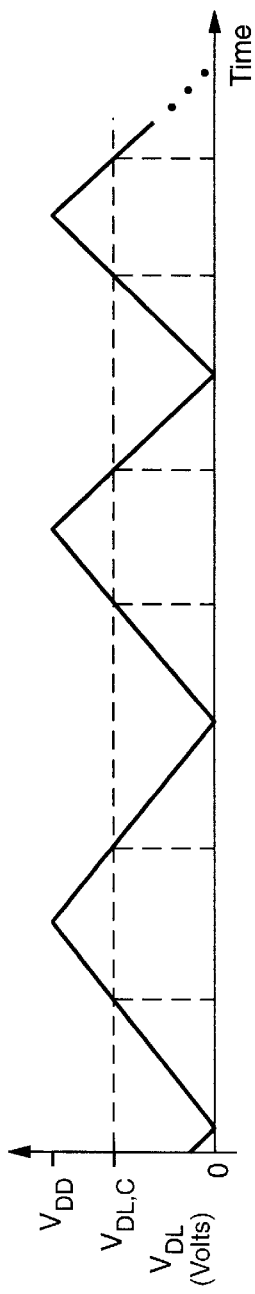
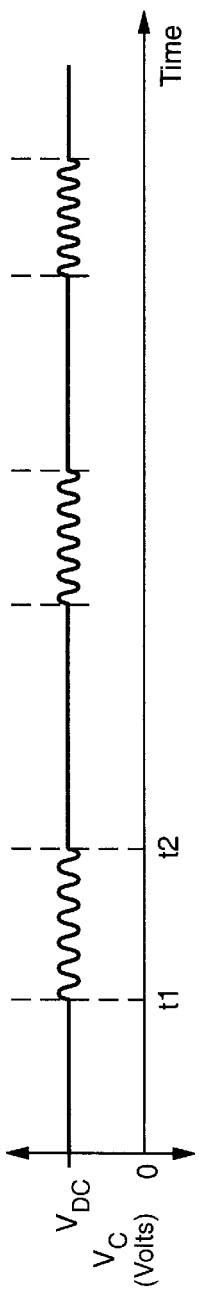
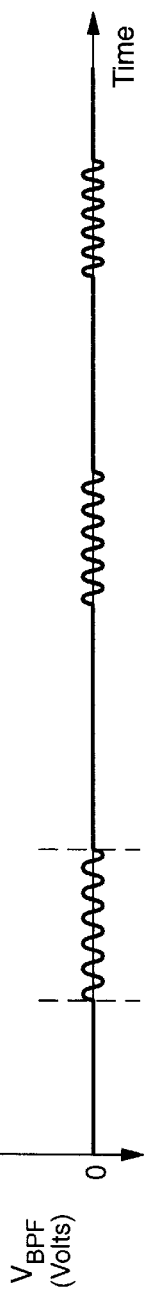
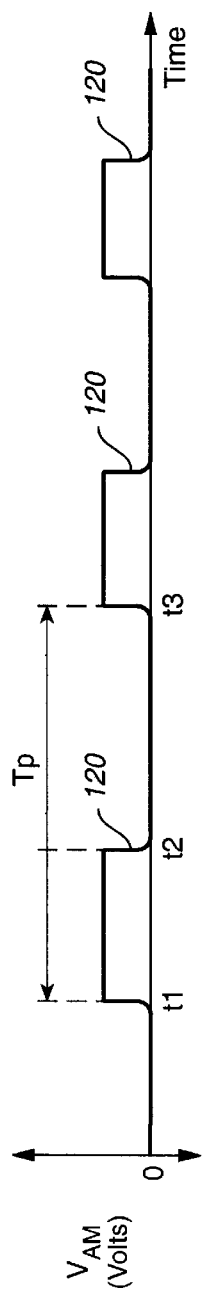
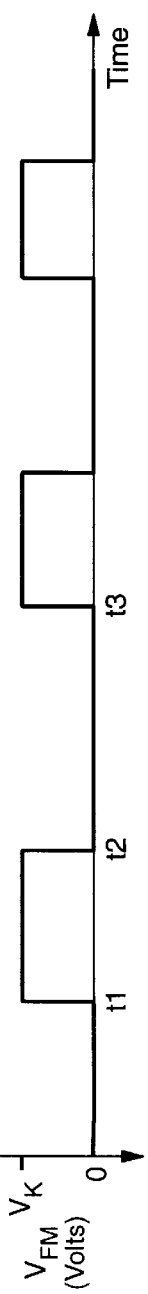

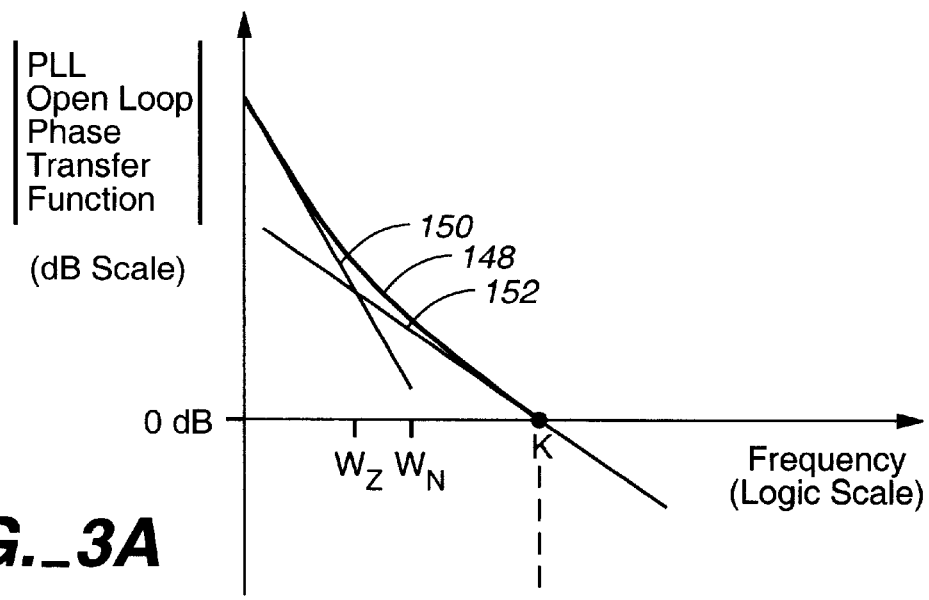
FIG._3A
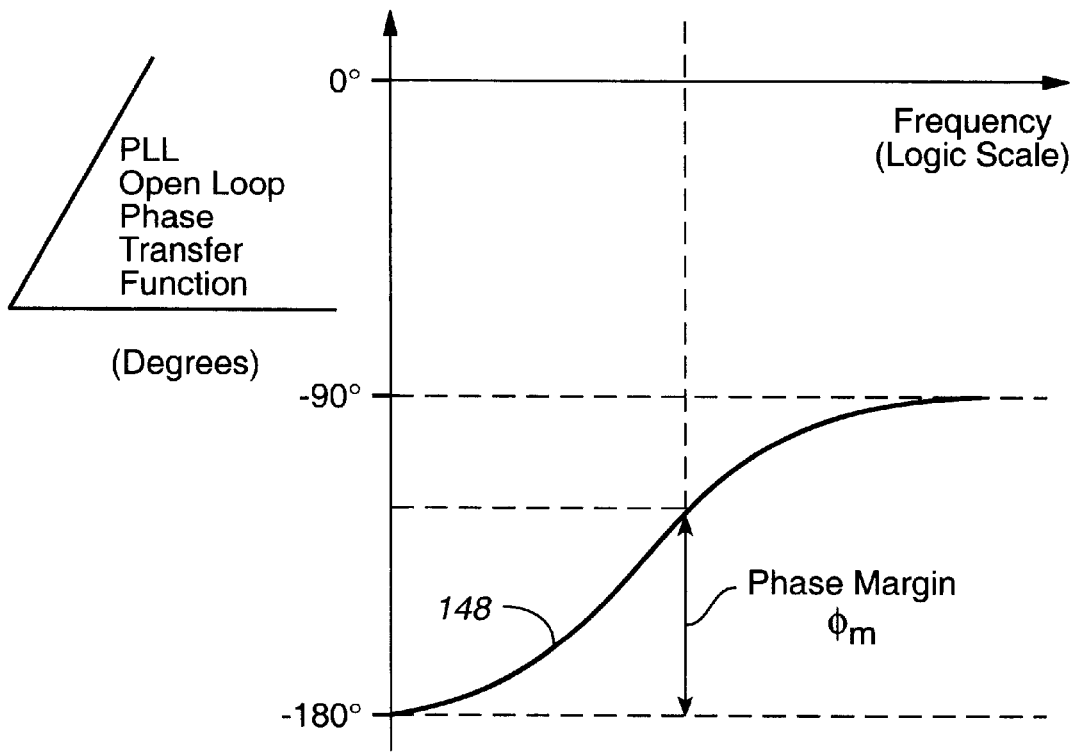
FIG._3B

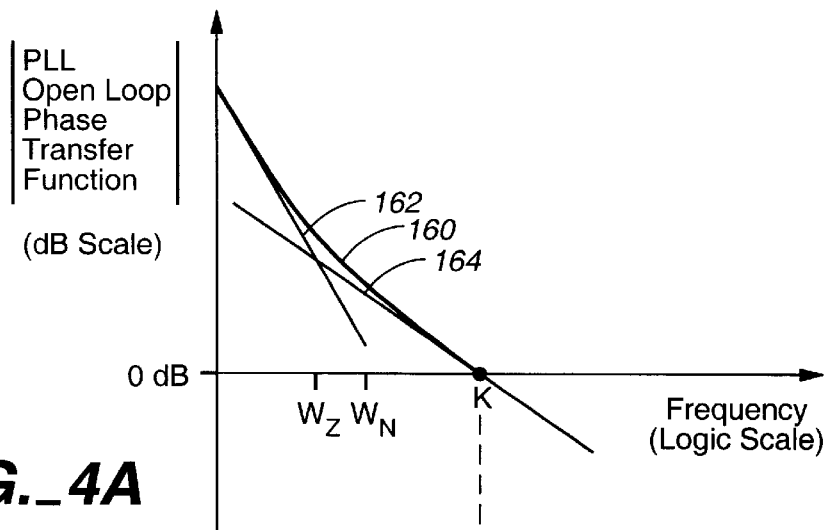
FIG._4A
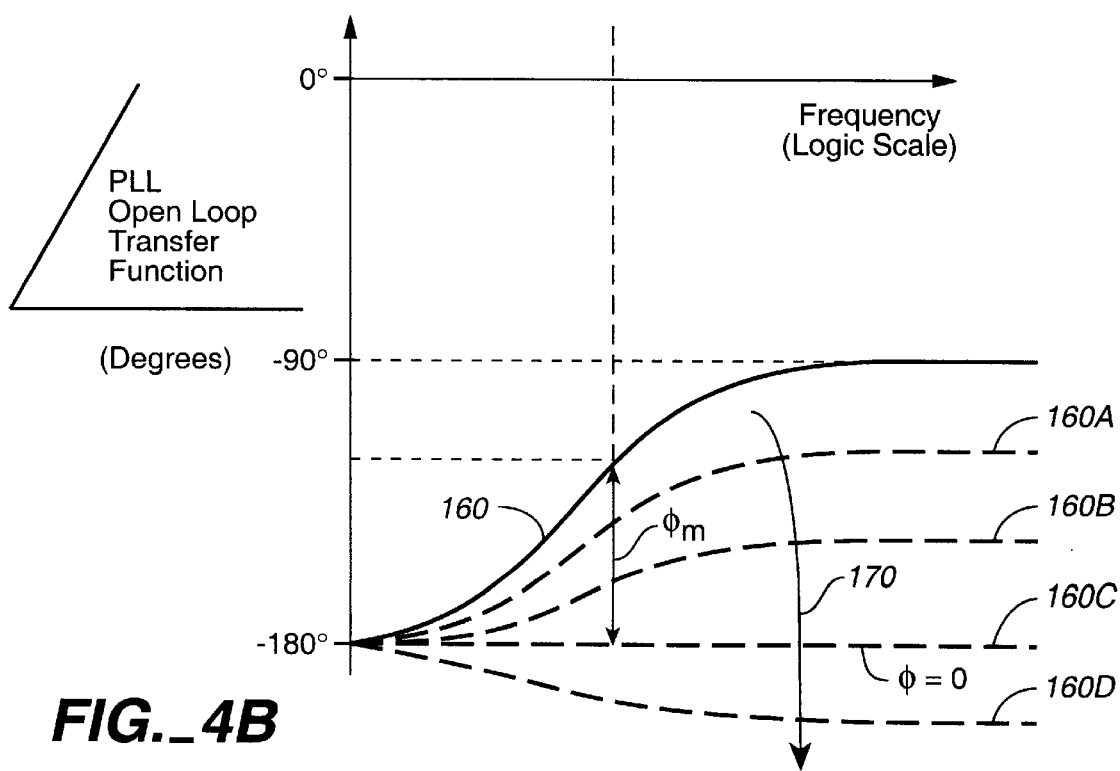
FIG._4B

US 6,262,634 B1

PHASE-LOCKED LOOP WITH BUILT-IN SELF-TEST OF PHASE MARGIN AND LOOP GAIN

BACKGROUND OF THE INVENTION

The present invention relates to semiconductor integrated circuits and, more particularly, to a circuit for measuring the phase margin and loop gain of a phase-locked loop.

A typical PLL includes a phase/frequency detector, a charge pump, a loop filter, a voltage controlled oscillator (VCO) and a frequency divider. The VCO generates a clock signal with a phase and frequency that is a function of the voltage applied to the oscillator. The phase/frequency detector detects a phase difference between the VCO output and the input signal. The phase/frequency detector generates a phase control signal as a function of the difference and applies the phase control signal to the charge pump, which increases or decreases the voltage across the loop filter. This voltage is applied to the VCO for controlling the oscillation frequency and phase. Once a PLL has locked a feedback signal onto the phase and frequency of a reference input signal, any remaining phase error between the reference feedback signal and the input signal is known as "jitter".

The performance of a second order PLL can be defined in terms of a damping factor ($\zeta$) and an un-damped natural frequency ($\omega_n$). These performance characteristics determine the phase margin ($\phi_m$) and the loop gain (K) for the PLL. In integrated circuit applications, it is important that these performance characteristics lie within predefined specifications. However, the phase margin and loop gain can vary by as much as a factor of two or more from one integrated circuit to the next due to variations in process, supply voltage and temperature, which are known as "PVT". Variations in the phase margin and loop gain that exceed specified margins can lead to difficulties in clock synchronization, accurate recovery of serial data streams and other functions commonly performed by PLLs.

SUMMARY OF THE INVENTION

One aspect of the present invention is directed to a phase-locked loop (PLL), which includes a PLL reference input, a PLL output and a phase detection loop coupled between the PLL reference input and the PLL output. The phase detection loop has a loop filter node. A delay element is coupled within the phase detection loop and has a variable delay, which can be increased to a critical delay at which the phase detection loop becomes unstable. A demodulator is coupled to the loop filter node and is adapted to demodulate a modulated voltage on the loop filter node. The demodulator has a demodulated output with a characteristic representative of a phase margin of the phase detection loop when the delay element has at least the critical delay.

Another aspect of the present invention is directed to a method of measuring phase margin of a phase-locked loop (PLL) having a reference input. The method includes: (a) applying a reference clock to the reference input; (b) providing a variable delay within the PLL; (c) increasing the variable delay until the PLL becomes unstable; and (d) generating a phase margin output related to the phase margin as a function of the variable delay at which the PLL becomes unstable.

Yet another aspect of the present invention is directed to a phase-locked loop (PLL), which includes a PLL reference input, a PLL output and a phase detection loop coupled between the PLL reference input and the PLL output. A delay circuit is coupled to the phase detection loop for introducing a delay into the phase detection loop and for varying the delay until the phase detection loop becomes unstable. A phase margin measuring circuit measures a phase margin of the PLL as a function of the delay introduced by the delay means when the phase detection loop becomes unstable.

BRIEF DESCRIPTION OF THE DRAWINGS

FIG. 1 is a block diagram of a phase-locked loop (PLL) having a built-in phase margin and loop gain measurement circuit according to one embodiment of the present invention.

FIGS. 2A–2E are timing diagrams, which illustrate the voltages on various nodes within the PLL shown in FIG. 1 during a test mode.

FIGS. 3A and 3B are graphs illustrating the open loop phase transfer function of a typical PLL, which has no variable delay element in the loop, as a function of frequency.

FIGS. 4A and 4B are graphs illustrating the open loop phase transfer function of the PLL shown in FIG. 1, which has a variable delay element in the loop, as a function of frequency.

DETAILED DESCRIPTION OF THE PREFERRED EMBODIMENTS

The phase-locked loop (PLL) of the present invention includes a self-test measurement of the phase margin and the loop gain for the PLL, which can be used to verify that the PLL is operational and the performance characteristics of the PLL are within predefined specifications. These measurements can be performed with circuitry that is fabricated with the PLL on an integrated circuit as part of a built-in self-test (BIST) feature for the PLL or with circuitry that is external to the integrated circuit.

FIG. 1 is a block diagram of a phase-locked loop (PLL) 10 having a built-in phase margin and loop gain measurement circuit according to one embodiment of the present invention. PLL 10 is implemented on an integrated circuit and includes phase/frequency detector 12, charge pump 14, voltage-controlled oscillator (VCO) 16, frequency divider 18 and loop filter 19, which together form a phase detection loop. Phase/frequency detector 12 has detector inputs 20 and 22 and charge pump control outputs 24 and 26. Outputs 24 and 26 are coupled to inputs 28 and 30 of charge pump 14. Charge pump 14 has an output 32 which is coupled to loop filter node 33 and input 34 of VCO 16. VCO 16 has an output 36 which is coupled to input 38 of frequency divider 18. Frequency divider 18 has an output 40 which is coupled to input 22 of phase/frequency detector 12 through variable delay element 42. Loop filter 19 includes resistor R1 and capacitor C1 which are coupled together in series between filter node 33 and supply terminal GND.

During operation, phase/frequency detector 12 detects a phase difference between a reference input signal $F_{IN}$ applied to detector input 20 and a feedback signal $F_{FB}$ applied to detector input 22. Phase/frequency detector 12 generates "up" and "down" signals on outputs 24 and 26 as a function of the difference. The up and down signals are applied to charge pump 14, which causes the charge pump to increase, decrease or not change the voltage on loop filter node 33. VCO 16 receives the voltage on filter node 33 and responsively increases, decreases or does not change its frequency of oscillation, and thus the frequency of oscillation of output signal $F_{OUT}$. Output signal $F_{OUT}$ is fed back to phase/frequency detector 12 as the feedback signal $F_{FB}$ through frequency divider 18 and variable delay element 42. This process continues until PLL 10 locks the feedback signal $F_{FB}$ onto the phase and frequency of the input reference signal $F_{IN}$. PLL 10 is an example of a type II second order PLL. However, any type of PLL having any order, such as second, third or fourth order, can be used with the present invention. As a second order PLL, various performance characteristics of PLL 10 can be defined in terms of a damping factor ($\zeta$) and an un-damped natural frequency ($\omega_n$). For example, PLL 10 has a phase margin ($\phi_m$) in radians and a loop gain (K) in radians/second, which are defined by the following relations:

$$\phi_m = \tan^{-1}\left[2\zeta\sqrt{2\zeta^2 + \sqrt{4\zeta^4 + 1}}\right] \qquad \text{EQ. 1}$$

$$K = 2\omega_n\zeta \qquad \text{EQ. 2}$$

A PLL having a damping factor greater than unity will have a step response that is stable, whereas a PLL having a damping factor less than unity will have a step response that oscillates. A typical desired damping factor for a PLL is about 1.0. However, other damping factors can be used, depending on the particular application in which the PLL is used and the desired performance characteristics.

In integrated circuit applications, it is important that these performance characteristics lie within predefined specifications. However, these characteristics can vary by as much as a factor of two or more from one integrated circuit to the next due to variations in process, supply voltage and temperature, which are known as "PVT". Therefore, it is desired to have the capability of measuring the phase margin ($\phi_m$) and the loop gain (K) for each integrated circuit instance.

PLL 10 includes a phase margin and loop measurement circuit 50, which is fabricated with the other components of PLL 10 on a single semiconductor integrated circuit. In an alternative embodiment, phase margin and loop measurement circuit 50 is external to the integrated circuit.

Phase margin and loop measurement circuit 50 includes variable delay element 42, control voltage generator 52, band pass filter 54, amplitude (AM) demodulator 56, frequency (FM) demodulator 58, duty cycle detector 60, peak detector 62 and comparators 64 and 66. In one embodiment variable delay element 42 includes a voltage-controlled delay line having a control voltage input 70, which is coupled to output 72 of control voltage generator 52. Variable delay element 42 can include other types of delay elements in alternative embodiments of the present invention.

Control voltage generator 52 generates a control voltage $V_{DL}$ on output 72, which controls the delay through variable delay element 42. In a normal operating mode, control voltage generator 52 sets $V_{DL}$ such that variable delay element 42 adds substantially no delay or minimal delay to PLL 10. In a test mode, a fixed frequency reference clock signal is applied to reference input $F_{IN}$, and control voltage generator 52 increases $V_{DL}$ until PLL 10 becomes unstable. As $V_{DL}$ increases, the delay $T_D$ through delay element 42 increases.

In one embodiment, control voltage $V_{DL}$ has a triangular waveform in the test mode, which repetitively increases from an initial value of about zero volts to a voltage above a critical voltage, $V_{DL,C}$, and then decreases back to zero volts. At the critical voltage $V_{DL,C}$, variable delay element 42 has a delay $T_C$ that causes the voltage $V_C$ on filter node 133 to burst into oscillation. The amount of additional delay required to cause PLL 10 to oscillate is monotonically related to the PLL phase margin $\phi_m$. Other types of increasing, decreasing or repetitive waveforms can also be used. For example, control voltage generator 52 can be adapted to incrementally increase control voltage $V_{DL}$ over time during the test mode.

The greater the phase margin of PLL, the greater the delay $T_C$ that is required to cause $V_C$ to oscillate. The phase margin $\phi_m$ of PLL 10 can be defined by the following relation, $$\phi_m = \frac{T_C}{T_K} \times 360° \text{ (Degrees)} \qquad \text{EQ. 3}$$

where TK is the loop gain period of PLL 10, which is given by, $$T_K = \frac{2\pi}{K} \text{ (seconds)} \qquad \text{EQ. 4}$$

Thus, if the loop gain K is known, the original phase margin $\phi_m$ can be determined from the delay $T_C$ that is required to cause PLL 10 to oscillate. The closed-loop 3 dB bandwidth of PLL 10 is approximately equal to the loop gain value K, for a PLL with a damping factor exceeding unity.

When PLL 10 is unstable, the voltage $V_C$ on loop filter node 33 will have DC and AC components. The AC components have characteristics that are representative of the original phase margin $\phi_m$ and the loop gain K of PLL 10. For example, the period of time during which $V_C$ oscillates as compared to the overall period of the $V_C$ waveform (when a triangular $V_{DL}$ waveform is applied to delay element 42) is representative of the original phase margin $\phi_m$. Also, the AC component has a frequency of modulation that closely approximates the loop gain K in radians per second. These characteristics of the AC components of $V_C$ are extracted by AM demodulator 56 and FM demodulator 58.

Band pass filter 54 has an input 80, which is coupled to loop filter node 33, and an output 82, which produces a bandpass filtered voltage $V_{BPF}$. Band pass filter 54 is a wide-band filter, which removes the DC and high frequency components from $V_C$. AM demodulator 56 has a input 84 coupled to output 82 for receiving $V_{BPF}$. Amplitude demodulator 56 generates an output voltage signal $V_{AM}$ on demodulator output 86, which has a duty cycle that is representative of the original phase margin $\phi_m$ of PLL 10, prior to the increase in the delay through variable delay element 42.

Demodulator output 86 is applied to input 88 of duty cycle detector 60, which generates a voltage $V_{\phi m}$ on output 90. The voltage $V_{\phi m}$ is proportional to the duty cycle of $V_C$ and thus the original phase margin $\phi_m$ of PLL 10. Comparator 64 has a non-inverting input 92 coupled to output 90, an inverting input 94 coupled to phase margin reference input 96 and an output 98. In one embodiment, phase margin reference input 96 is tied to a reference voltage that represents a predetermined phase margin specification for PLL 10. If $V_{\phi m}$ is greater than the phase margin reference voltage, then comparator 64 generates a high voltage output 98, which indicates that the phase margin of PLL 10 is within the specification. If $V_{\phi m}$ is less than the phase margin reference voltage, then comparator 64 generates a low voltage on output 98, which indicates that the phase margin of PLL 10 is outside of the specification. In an alternative embodiment, two comparators can be used in a similar manner to detect whether $V_{\phi m}$ is within a range between high and low reference levels.

The loop gain K is measured by FM demodulator 58. By measuring the frequency of the AC component of $V_C$ during phase oscillation, the value of the loop gain K (radians/second) can be obtained. FM demodulator 58 has an input 100, which is coupled to band pass filter output 82 for receiving $V_{BPF}$. FM demodulator 58 generates a voltage signal $V_{FM}$ on demodulator output 102, which has a peak voltage that is proportional to the loop gain K of PLL 10. Peak detector 62 has an input 104, which is coupled to demodulator output 102 for detecting the peak voltage of $V_{FM}$ during oscillation of PLL 10. Peak detector 62 has an output 106, which produces a voltage $V_K$, which is representative of the measured peak voltage of $V_{FM}$.

Output 106 is coupled to non-inverting input 108 of comparator 66. The inverting input 110 of comparator 66 is coupled to loop gain reference input 112. In one embodiment, loop gain reference input 112 is tied to a reference voltage that represents a threshold loop gain. Comparator 66 compares $V_K$ with the pre-selected loop gain reference voltage level applied to reference input 112. If the value of $V_K$ exceeds the loop gain reference value, comparator 66 will generate a high voltage on comparator output 114 indicating a "good" condition. If $V_K$ is less than the loop gain reference value, then that comparator 66 will generate a low voltage on output 114 indicating a "bad" condition. In an alternative embodiment, an additional comparator (not shown) is used to allow $V_K$ to be compared with a predetermined specification range.

In another alternative embodiment, the values of $V_K$ and $V_{\phi m}$ are provided to additional circuitry, which calculates the actual loop gain K and the original phase margin $\phi_m$. Also, additional circuitry can be used to translate the values of $V_K$ and $V_{\phi m}$ to a damping factor for PLL 10 according to known relationships.

When phase margin and loop gain measurement circuit 50 is implemented in a built-in self-test circuit for PLL 10, acceptable values of phase margin and loop gain known in advance, and representative threshold voltages are applied to reference inputs 96 and 112. Good/bad indications will thereby be available on outputs 98 and 114 for both phase margin and loop gain. These outputs can be used to verify that PLL 10 is operational and that the measured values of the phase margin and loop gain are within the predetermined specifications.

FIGS. 2A–2E are timing diagrams, which illustrate the voltages on various nodes within PLL 10 during the test mode. FIG. 2A illustrates the voltage $V_{DL}$ as a function of time. $V_{DL}$ periodically rises from zero volts to a supply voltage VDD and then decreases from supply voltage VDD to zero volts. At the critical voltage, $V_{DL,C}$, the delay through variable delay element 42 is sufficient to cause the voltage $V_C$ on filter node 33 to oscillate about a $D_C$ level, $V_{DC}$, as shown in FIG. 2B. The voltage $V_C$ oscillates from time t1 to time t2, during which $V_{DL}$ exceeds $V_{DL,C}$.

FIG. 2C illustrates the filtered voltage VBPF at the output of band pass filter 54. Band pass filter 54 takes out the DC component $V_{DC}$ and any high frequency components from $V_C$. In an alternative embodiment, this band pass filtering can be performed within demodulators 56 and 58.

FIG. 2D illustrates the output $V_{AM}$ of amplitude demodulator 56 over time. The voltage signal $V_{AM}$ has a series of pulses, which are coincident with the time during which $V_C$ oscillates. The voltage signal $V_{AM}$ has a period $T_P$=t3−t1.

The percent of time during which $V_{AM}$ is high at pulses 120 as compared to the total period $T_P$ (i.e. the duty cycle of $V_{AM}$) is representative of the original phase margin $\phi_m$ of PLL 10. This duty cycle is detected by duty cycle detector 60 shown in FIG. 1.

FIG. 2E shows the value of $V_{FM}$ over time. Between times t1 and t2, during which $V_C$ is oscillating, $V_{FM}$ has a peak value $V_K$, which is proportional to the loop gain K of PLL 110. This peak is detected by peak detector 62 shown in FIG. 1.

FIG. 3A is a graph illustrating the magnitude of the open loop phase transfer function of a typical PLL, which has no variable delay element in the loop, as a function of frequency. The open loop transfer function 148 is approximated by straight lines 150 and 152, which represent a 40 dB/decade roll off and a 20 dB/decade roll off, respectively. Transfer function 148 has a zero frequency $\omega_Z$, an un-damped natural frequency $\omega_N$, and a loop gain K, which occurs at the cross-over frequency.

FIG. 3B is a graph illustrating the phase angle of the open loop phase transfer function in degrees as a function of frequency for the typical PLL. Transfer function 148 has a phase margin $\phi_m$, which is measured at the unity-gain cross-over frequency shown in FIG. 3A.

FIG. 4A is a graph illustrating the magnitude of the open loop phase transfer function in dB for PLL 10, which has variable delay element 42 in the loop. Transfer function 160 has straight line approximations 162 and 164, which represent a 40 dB/decade roll off and a 20 dB/decade roll off, respectively. Transfer function 160 has a zero frequency $\omega_Z$, an un-damped natural frequency $\omega_N$ and a loop gain K. The transfer function 160 shown in FIG. 4A is identical to the transfer function 148 shown in FIG. 3A.

FIG. 4B is a graph showing the phase angle of the open loop phase transfer function in degrees for PLL 10 as a function of frequency. Transfer function 160 (shown in solid) has an original phase margin $\phi_m$. Dashed lines 160A–160D represent changes in the open loop phase transfer function along arrow 170 as the delay of variable delay element 42 is progressively increased. At 160C, the phase margin $\phi_m$ becomes zero, which causes PLL 10 to become unstable. Thus, the increase in delay that is required to yield $\phi_m$=0 is related to the value of the original phase margin. The greater the phase margin, the greater the delay that is necessary to cause the PLL to oscillate.

Referring back to FIG. 1, the phase margin and loop gain of PLL 10 can be measured in a variety of ways in alternative embodiments of the present invention. For example, the phase margin can be measured from the duty cycle of $V_{FM}$ as opposed to the duty cycle of $V_{AM}$. As shown in FIGS. 2D and 2E, the $V_{FM}$ waveform has the same duty cycle as the $V_{AM}$ waveform. In this embodiment, amplitude demodulator 56 can be removed, and the output 102 of frequency demodulator 58 can be coupled to the input of duty cycle detector 60, as shown by dashed line 180. Duty cycle detector 60 can then detect the duty cycle of $V_{FM}$.

In another alternative embodiment, the phase margin $\phi_m$ can be calculated by measuring the value of the critical control voltage $V_{DL,C}$ at which PLL 10 begins to oscillate. In this embodiment, control voltage output 72 is coupled to the input of voltage measurement circuit 190 (shown in phantom). Voltage measurement circuit 190 has a trigger input 192, which is coupled to either $V_{AM}$ or $V_{FM}$. At the rising edge of $V_{AM}$ of $V_{FM}$, voltage measurement circuit 190 measures the voltage $V_{DL,C}$ and produces an output 194 indicative of the measurement. At the rising edge of $V_{AM}$ or $V_{FM}$, variable delay element 42 has the critical delay $T_C$, which causes PLL 10 to become unstable. This critical voltage, $V_{DL,C}$ is shown in FIG. 2A. The measured voltage $V_{DL,C}$ is applied to a look-up table or similar circuit 195, which translates the value of $V_{DL,C}$ into a corresponding phase margin value or flag on output 196. Look-up table 195 incorporates a characterization of $T_D$ relative to $V_{DL}$ and a characterization of $V_{DL}$ relative to the original phase margin. Any type of voltage measurement circuit, look-up table or equivalent can be used in accordance with the present invention, which can be implemented with analog circuitry, combinational logic, a state machine or a microprocessor for example.

Although the present invention has been described with reference to preferred embodiments, workers skilled in the art will recognize that changes may be made in form and detail without departing from the spirit and scope of the invention. For example, the present invention can be implemented on integrated circuits having various technologies, such as MOS technology. Also, the particular PLL described herein is provided as an example only. Various other types of PLL circuits can also be used. Also, the functions of the phase margin and loop gain measurement circuit of the present invention can be performed in the analog domain or the digital domain or a combination of both. Digital elements can be implemented in hardware or software and can include combinational logic, state machines, a microprocessor or a programmed computer, for example. The term "coupled" used in the specification and the claims can include various types of connections or couplings and can include a direct connection or a connection through one or more intermediate components.

What is claimed is:

1. A phase-locked loop (PLL) comprising:

a PLL reference input;

a PLL output;

a phase detection loop coupled between the PLL reference input and the PLL output and having a loop filter node;

a delay element coupled within the phase detection loop and having a variable delay, which can be increased to a critical delay at which the phase detection loop becomes unstable; and a first demodulator, which is coupled to the loop filter node and is adapted to demodulate a modulated voltage on the loop filter node, the demodulator having a demodulated output with a characteristic representative of a phase margin of the phase detection loop when the delay element has at least the critical delay.

2. The PLL of claim 1 wherein the delay element comprises a voltage-controlled delay element having a control voltage input.

3. The PLL of claim 1 wherein the first demodulator comprises an amplitude demodulator and the PLL further comprises:

a duty cycle detector having a duty cycle input coupled to the demodulated output and a duty cycle output that is representative of the phase margin.

4. The PLL of claim 3 and further comprising:

a band-pass filter coupled between the loop filter node and the amplitude demodulator;

a comparator having first and second inputs and a phase margin output, wherein the first input is coupled to the duty cycle output; and a phase margin reference input coupled to the second input of the comparator.

5. The PLL of claim 1 wherein the first demodulator comprises a frequency demodulator and the PLL further comprises:

a duty cycle detector having a duty cycle input coupled to the demodulated output and a duty cycle output that is representative of the phase margin.

6. The PLL of claim 5 and further comprising:

a band-pass filter coupled between the loop filter node and the frequency demodulator;

a comparator having first and second inputs and a phase margin output, wherein the first input is coupled to the duty cycle output; and a phase margin reference input coupled to the second input of the comparator.

7. The PLL of claim 1 and further comprising:

a second, frequency demodulator coupled to the loop filter node, which is adapted to demodulate a frequency component of the modulated voltage on the loop filter node, the second demodulator having a demodulated output representative of a loop gain of the phase detection loop when the delay element has the critical delay.

8. The PLL of claim 7 and further comprising:

a band-pass filter coupled between the loop filter node and the second, frequency demodulator;

a peak voltage detector having a peak detector input coupled to the demodulated output of the second, frequency demodulator and a peak detector output; and a comparator having first and second comparator inputs and a comparator output, wherein the first comparator input is coupled to the peak detector output; and a loop gain reference input coupled to the second comparator input.

9. The PLL of claim 1 wherein the PLL reference input, the PLL output, the phase detection loop, the delay element and the first demodulator are fabricated together on a single semiconductor integrated circuit.

10. The PLL of claim 1 wherein the PLL reference input, the PLL output and the phase detection loop are fabricated together on a single semiconductor integrated circuit, and wherein the delay element and the first demodulator are external to the single semiconductor integrated circuit.

11. A method of measuring phase margin of a phase-locked loop (PLL) having a reference input, the method comprising:

(a) applying a reference clock to the reference input;

(b) providing a variable delay within the PLL;

(c) increasing the variable delay until the PLL becomes unstable; and (d) generating a phase margin output related to the phase margin as a function of the variable delay at which the PLL becomes unstable.

12. The method of claim 11 wherein:

the providing step (b) comprises providing a voltage-controlled delay element within the PLL, which has a control voltage input; and the increasing step (c) comprises applying a voltage to the control voltage input and increasing the voltage until the PLL becomes unstable.

13. The method of claim 12 wherein the generating step (d) comprises:

(d) (1) producing a measure of the voltage that is applied to the control voltage input when the PLL becomes unstable; and (d) (2) generating the phase margin output as a function of the measure of the voltage.

14. The method of claim 11 wherein the PLL has a loop filter node and the generating step (d) comprises:

(d) (1) demodulating an amplitude modulated component of a voltage on the filter node when the PLL is unstable to produce an amplitude demodulated signal; and (d) (2) generating the phase margin output as a function of a duty cycle of the amplitude demodulated signal.

15. The method of claim 14 wherein the generating step (d) (2) comprises:

(d) (2) (i) generating a voltage representative of the duty cycle; and (d) (2) (ii) comparing the voltage representative of the duty cycle with a phase margin reference voltage to produce the output.

16. The method of claim 11 and the method further comprises:

(e) generating a loop gain output related to a loop gain of the PLL as a function of the variable delay at which the PILL becomes unstable.

17. The method of claim 16 wherein the PLL has a loop filter node and the step of generating step (e) comprises:

(e) (1) demodulating a frequency modulated component of a voltage on the filter node when the PLL is unstable to produce a frequency demodulated signal; and (e) (2) generating the loop gain output as a function of a peak voltage of the frequency demodulated signal.

18. The method of claim 17 wherein the generating step (e) (2) comprises:

(e) (2) (i) generating a voltage representative of the peak voltage; and (e) (2) (ii) comparing the voltage representative of the peak voltage with a loop gain reference voltage to produce the loop gain output.

19. The method of claim 11 wherein the PLL has a loop filter node and the generating step (d) comprises:

(d) (1) demodulating a frequency modulated component of a voltage on the filter node when the PLL is unstable to produce a frequency demodulated signal; and (d) (2) generating the phase margin output as a function of a duty cycle of the frequency demodulated signal.

20. A phase-locked loop (PLL) comprising:

a PLL reference input;

a PLL output;

a phase detection loop coupled between the PLL reference input and the PLL output;

delay means for introducing a delay into the phase detection loop and varying the delay until the phase detection loop becomes unstable; and phase margin measuring means for measuring a phase margin of the PLL as a function of the delay introduced by the delay means when the phase detection loop becomes unstable.

21. The PLL of claim 20 wherein:

the delay means comprises means for providing a voltage-controlled delay element, which has a control voltage input, within the phase detection loop, applying a voltage to the control voltage input and increasing the voltage until the PLL becomes unstable; and the phase margin measuring means comprises means for producing a measure of the voltage that is applied to the control voltage input when the PLL becomes unstable.

22. The PLL of claim 20 wherein:

the phase detection loop comprises a loop filter node; and the phase margin measuring means comprises means for demodulating an amplitude modulated component of a voltage on the filter node when the PLL is unstable to produce an amplitude demodulated signal and for measuring the phase margin as a function of a duty cycle of the amplitude demodulated signal.

23. The PLL of claim 20 wherein:

the phase detection loop comprises a loop filter node; and the phase margin measuring means comprises means for demodulating a frequency modulated component of a voltage on the filter node when the PLL is unstable to produce an frequency demodulated signal and for measuring the phase margin as a function of a duty cycle of the frequency demodulated signal.

24. The PLL of claim 20 and further comprising:

loop gain measuring means for measuring a loop gain of the phase detection loop as a function of the delay introduced by the delay means when the phase detection loop becomes unstable.

25. The PLL of claim 24 wherein:

the phase detection loop comprises a loop filter node; and the loop gain measuring means comprises means for demodulating a frequency modulated component of a voltage on the filter node when the PLL is unstable to produce an frequency demodulated signal and for measuring the loop gain as a function of a peak voltage of the frequency demodulated signal.

* * * * *